United States Patent
Hassan et al.

(10) Patent No.: US 10,837,105 B1
(45) Date of Patent: Nov. 17, 2020

(54) MULTILAYER BARRIER AND METHOD OF FORMATION

(71) Applicant: Seagate Technology LLC, Cupertino, CA (US)

(72) Inventors: Sameh Hassan, Londonderry (GB); Marcus Ormston, Londonderry (GB); Emeline Hassen, Londonderry (GB); Gabriel McCafferty, Londonderry (GB)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 16/238,757

(22) Filed: Jan. 3, 2019

(51) Int. Cl.
C23C 16/40 (2006.01)
C23C 16/458 (2006.01)
C23C 16/56 (2006.01)
G11B 5/21 (2006.01)

(52) U.S. Cl.
CPC ........ *C23C 16/403* (2013.01); *C23C 16/4583* (2013.01); *C23C 16/56* (2013.01); *G11B 5/21* (2013.01)

(58) Field of Classification Search
CPC ... H01L 43/12; H01L 21/00; H01L 21/02104; H01L 21/0251; H01L 29/04; H01L 29/08; H01L 29/12; H01L 29/82; G11C 15/02
USPC ...... 360/327.32, 324.2, 328; 428/811.1, 800; 257/421; 427/127, 130
See application file for complete search history.

(56) References Cited

U.S. PATENT DOCUMENTS

| | | | |
|---|---|---|---|
| 7,443,639 B2 | 10/2008 | Parkin | |
| 7,488,609 B1 | 2/2009 | Lin et al. | |
| 8,008,097 B2 | 8/2011 | Parkin | |
| 8,202,572 B2 | 6/2012 | Zhao et al. | |
| 8,373,948 B2 | 2/2013 | Zeltser | |
| 8,557,407 B2 | 10/2013 | Zhao et al. | |
| 9,293,698 B2 | 3/2016 | Whig et al. | |
| 9,444,037 B2 | 9/2016 | Whig et al. | |
| 9,514,160 B2 | 12/2016 | Song et al. | |
| 9,890,449 B2 | 2/2018 | He et al. | |
| 10,014,465 B1* | 7/2018 | Liu | H01F 10/32 |
| 2008/0088980 A1* | 4/2008 | Kitagawa | H01F 10/329 360/313 |
| 2009/0108383 A1* | 4/2009 | Horng | H01L 43/08 257/421 |
| 2013/0234266 A1 | 9/2013 | Prejbeanu et al. | |
| 2015/0056368 A1* | 2/2015 | Wang | G11B 5/66 427/130 |
| 2019/0123262 A1* | 4/2019 | Lee | H01L 43/02 |

* cited by examiner

*Primary Examiner* — Tabassom Tadayyon Eslami
(74) *Attorney, Agent, or Firm* — Westman, Champlin & Koehler, P.A.

(57) ABSTRACT

A multi-layer barrier and method of formation. The method includes applying oxidation to a top of a reference layer, and depositing a plurality of different metal layers over the reference layer. The method also includes providing different oxidation doses at different temperatures to different layers of the plurality of metal layers. The method further includes performing an annealing operation after depositing at least two of the plurality of different metal layers.

20 Claims, 6 Drawing Sheets

MULTILAYER BARRIER AND METHOD OF FORMATION

SUMMARY

In one embodiment, a method includes applying oxidation to a top of a reference layer, and depositing a plurality of different magnesium layers over the reference layer. The method a includes providing different oxidation doses at different temperatures to different layers of the plurality of magnesium layers. The method further includes performing an annealing operation after depositing at least two of the plurality of different magnesium layers.

In another embodiment, a method includes applying oxidation to a top of a reference layer, and depositing a plurality of different magnesium layers over the reference layer. The method also includes providing oxidation doses at different temperatures to different layers of the plurality of magnesium layers.

In yet another embodiment, a method of forming a metal oxide barrier layer is provided. The method includes applying oxidation to a top of a reference layer, and depositing a plurality of different metal layers over the reference layer. The method also includes providing different oxidation doses at different temperatures to different layers of the plurality of metal layers. The method further includes performing an annealing operation after depositing at least two of the plurality of different metal layers.

Other features and benefits that characterize embodiments of the disclosure will be apparent upon reading the following detailed description and review of the associated drawings.

DETAILED DESCRIPTION OF ILLUSTRATIVE EMBODIMENTS

Embodiments of the disclosure relate to a multi-layer barrier and method of formation of the multi-layer barrier. However, prior to providing additional details regarding the different embodiments, a description of an illustrative operating environment is provided below.

Figure 1:
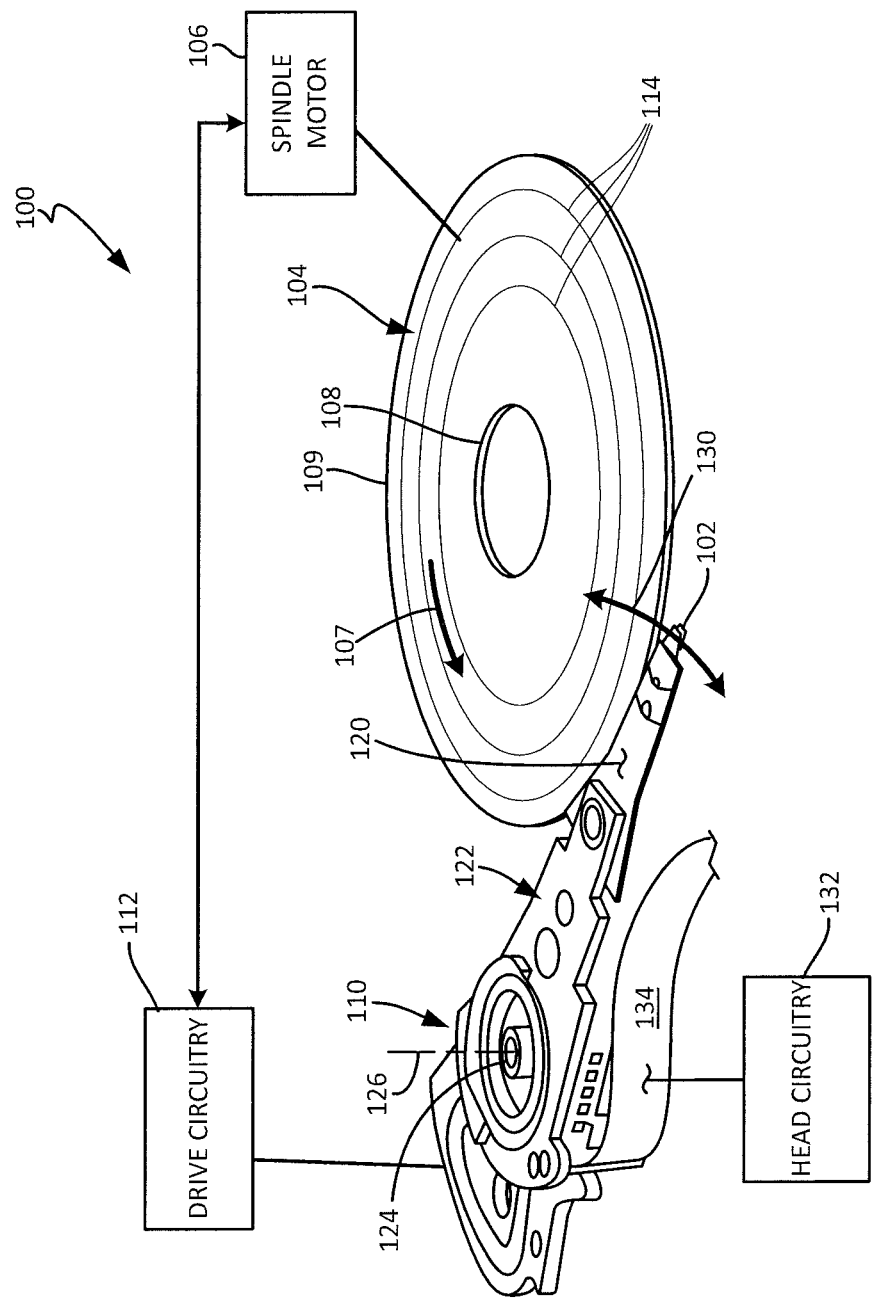
FIG. 1 is a schematic illustration of a data storage system including a data storage medium and a head for reading data from and/or writing data to the data storage medium.

FIG. 1 shows an illustrative operating environment in which certain specific embodiments disclosed herein may be incorporated. The operating environment shown in FIG. 1 is for illustration purposes only. Embodiments of the present disclosure are not limited to any particular operating environment such as the operating environment shown in FIG. 1. Embodiments of the present disclosure are illustratively practiced within any number of different types of operating environments.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

FIG. 1 is a schematic illustration of a data storage device 100 including a data storage medium and a head for reading data from and/or writing data to the data storage medium. In data storage device 100, head 102 is positioned above storage medium 104 to read data from and/or write data to the data storage medium 104. In the embodiment shown, the data storage medium 104 is a rotatable disc or other magnetic storage medium that includes a magnetic storage layer or layers. For read and write operations, a spindle motor 106 (illustrated schematically) rotates the medium 104 as illustrated by arrow 107 and an actuator mechanism 110 positions the head 102 relative to data tracks 114 on the rotating medium 104 between an inner diameter 108 and an outer diameter 109. Both the spindle motor 106 and actuator mechanism 110 are connected to and operated through drive circuitry 112 (schematically shown). The head 102 is coupled to the actuator mechanism 110 through a suspension assembly which includes a load beam 120 connected to an actuator arm 122 of the mechanism 110 for example through a swage connection. Although FIG. 1 illustrates a single load beam coupled to the actuator mechanism 110, additional load beams 120 and heads 102 can be coupled to the actuator mechanism 110 to read data from or write data to multiple discs of a disc stack. The actuator mechanism 110 is rotationally coupled to a frame or deck (not shown) through a bearing 124 to rotate about axis 126. Rotation of the actuator mechanism 110 moves the head 102 in a cross track direction as illustrated by arrow 130.

The head 102 includes one or more transducer elements (not shown in FIG. 1) coupled to head circuitry 132 through flex circuit 134. Details regarding elements of a head such as 102 are provided below in connection with FIG. 2.

Figure 2:
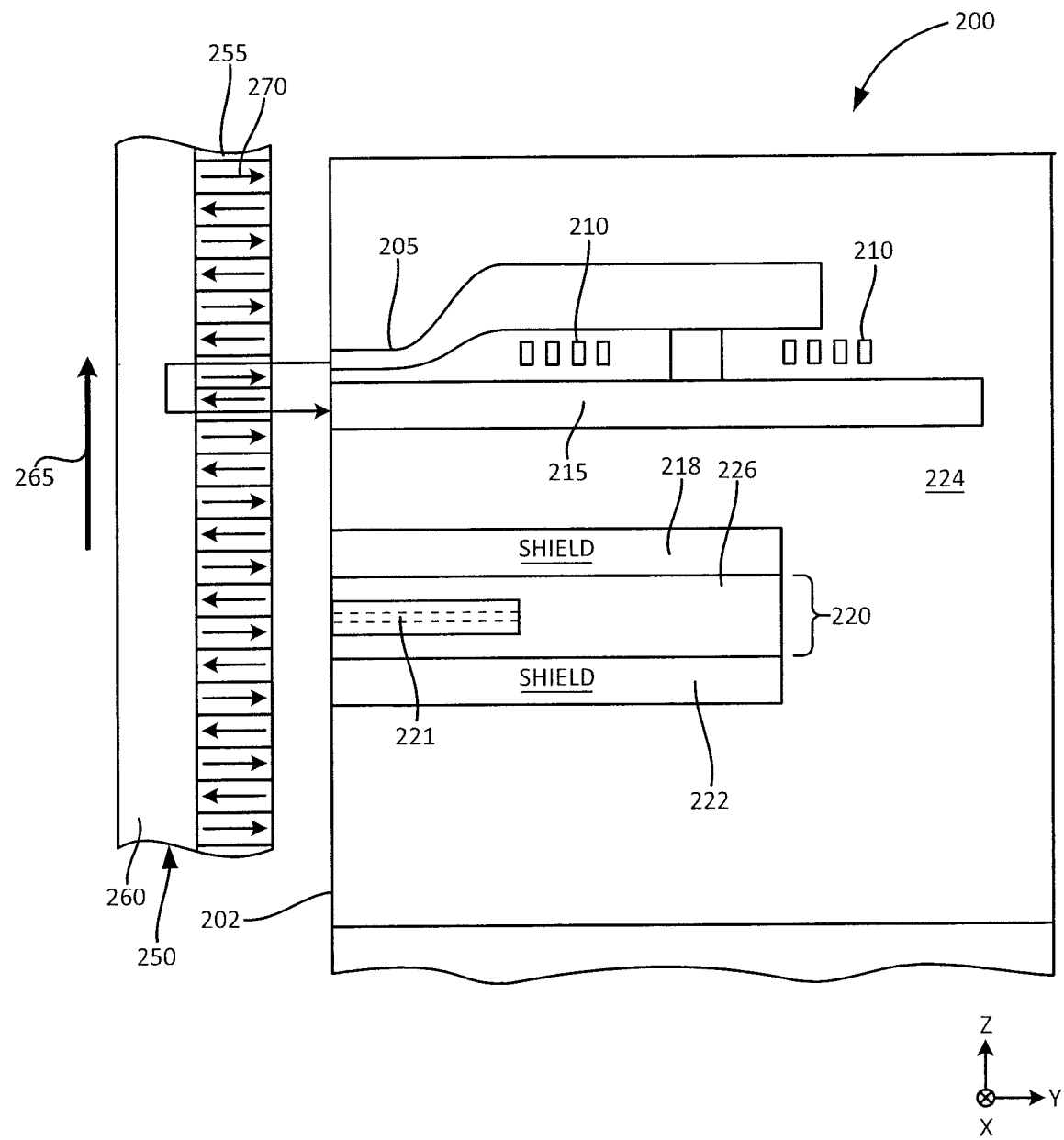
FIG. 2 is a schematic diagram of a cross-section of one embodiment of a recording head that reads from and writes to a storage medium.

FIG. 2 is a schematic diagram showing a cross-sectional view of portions of a recording head 200 and a data storage medium 250 taken along a plane substantially normal to a plane of a bearing surface (for example, an air bearing surface (ABS)) 202 of recording head 200. The recording head elements shown in FIG. 2 are illustratively included in a recording head such as recording head 102 in FIG. 1.

Medium 250 is illustratively a data storage medium such as medium 104 in FIG. 1. Those skilled in the art will recognize that recording heads and recording media commonly include other components. Embodiments of the present disclosure are not limited to any particular recording heads or media. Embodiments of the present disclosure may be practiced in different types of recording heads and media.

Recording head 200 includes a write pole 205, a magnetization coil 210, a return pole 215, a top shield 218, a read transducer 220, a bottom shield 222 and a wafer overcoat 224. Storage medium 250 includes a recording layer 255 and an underlayer 260. Storage medium 250 rotates in the direction shown by arrow 265. Arrow 265 is illustratively a direction of rotation such as arrow 107 in FIG. 1.

In an embodiment, electric current is passed through coil 210 to generate a magnetic field. The magnetic field passes from write pole 205, through recording layer 255, into underlayer 260, and across to return pole 215. The magnetic field illustratively records a magnetization pattern 270 in recording layer 255. Read transducer 220 senses or detects magnetization patterns in recording layer 255, and is used in retrieving information previously recorded to layer 255.

Read transducer 220 includes a multi-layer barrier 221, which is formed by a technique that helps reduce RA (resistance-area product) without reducing tunnel magnetoresistance (TMR). An example of an individual sensor that includes a multi-layer barrier such as 221 is described below in connection with FIG. 3. Formation of a multi-layer barrier such as 221 is described further below in connection with FIG. 5.

Figure 3:
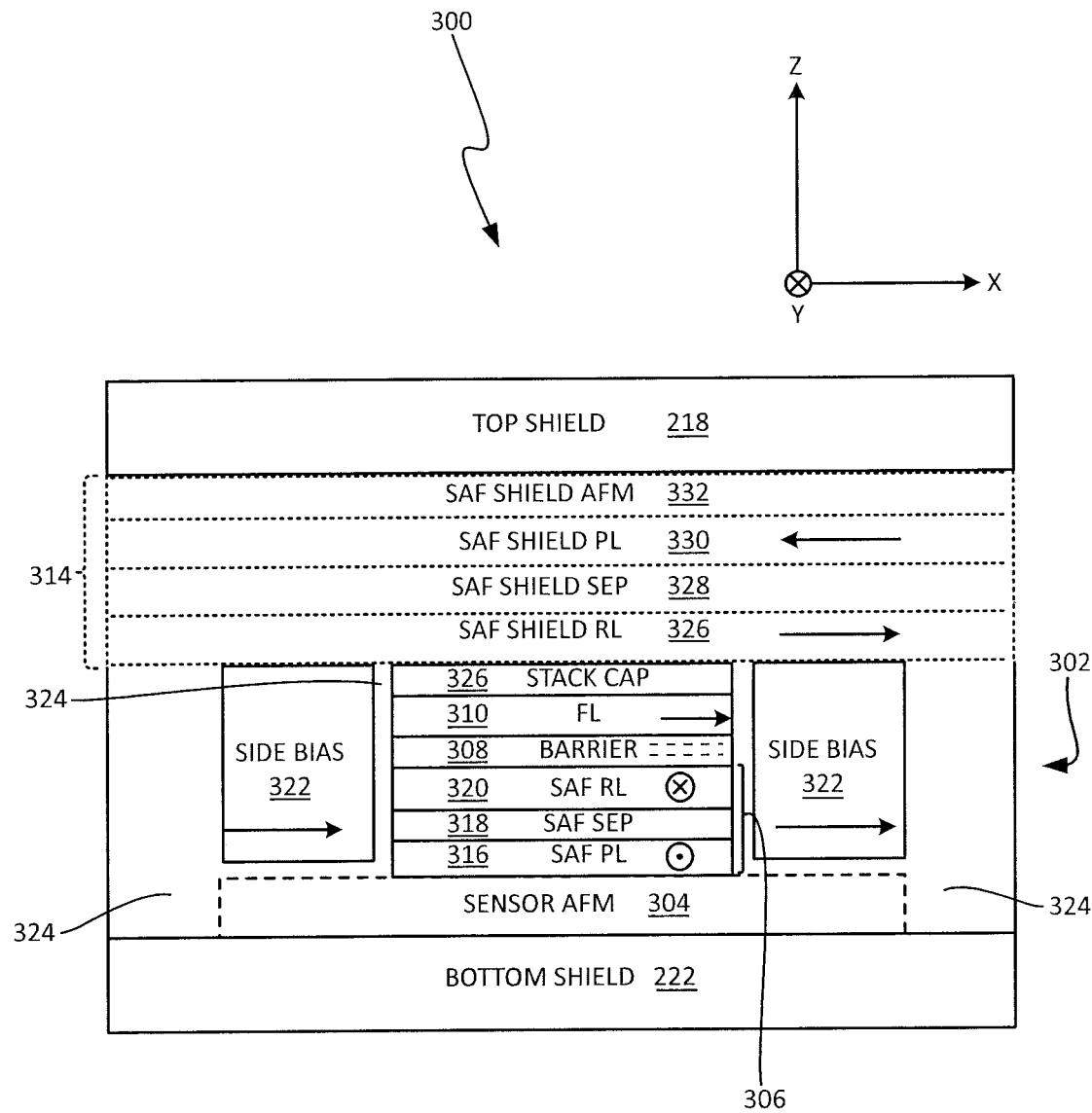
FIG. 3 is a bearing surface view of a magnetic reproducing device having a read sensor.

FIG. 3 is a schematic block diagram illustrating an example read head 300 including a magnetoresistive sensor 302 having a multi-layer barrier. The magnetoresistive sensor 302 is positioned between top shield 218 and bottom shield 222. Top and bottom shields 218 and 222, which may be made of a material having high magnetic permeability, reduce or substantially block extraneous magnetic fields, such as, for example, those from adjacent bits on data discs from impacting the magnetoresistive sensor 302, thus improving the performance of the magnetoresistive sensor 302. In one implementation, the top and bottom shields 218 and 222 permit magnetic fields from the bit directly under magnetoresistive sensor 302 to affect the magnetoresistive sensor 302, and thus be read.

The magnetoresistive sensor 302 includes a plurality of layers including a sensor antiferromagnetic (AFM) layer 304, a sensor stack synthetic antiferromagnetic (SAF) structure 306, a multi-layer barrier 308, a free layer or sensing layer 310 and a stack cap 312. A SAF shielding structure 314 may optionally be included above the stack cap 312. Dashed lines are used to represent elements within structure 314 to indicate that structure 314 is optional. Also, a dashed line is used for AFM layer 304 because, in some embodiments, AFM layer 304 may be recessed behind the bearing surface. In such embodiments, AFM layer 304 is not present between the sensor SAF structure 306 and bottom shield 222 at the bearing surface. However, in such embodiments, the AFM layer 304 is behind the bearing surface. Further, in some embodiments, AFM layer 304 may be completely excluded from the magnetoresistive sensor.

In the embodiment shown in FIG. 3, the sensor SAF structure 306 includes a pinned layer 316 a thin separation layer 318, which may comprise a metal such as ruthenium (Ru) in some embodiments, and a reference layer 320. The magnetic moments of each of the pinned layer 316 and the reference layer 320 are not allowed to rotate under magnetic fields in the range of interest (for example, magnetic fields generated by the bits of data stored on the data discs). The magnetic moments of the reference layer 320 and the pinned layer 316 are generally oriented normal to the plane (e.g., the y direction) of FIG. 3 and anti-parallel to each other.

The magnetic moment of the free layer 310 is free to rotate under the influence of an applied magnetic field in a range of interest. The read head 300 further includes side biasing magnets or side shields 322, which produce a magnetic field that biases the free layer 310 with a magnetic moment parallel to the plane of the figure and generally oriented horizontally. This bias prevents the magnetic moment of the free layer 310 from drifting due to, for example, thermal energy, which may introduce noise into the data sensed by the read head 300. The bias is sufficiently small, however, that the magnetic moment of the free layer 310 can change in response to an applied magnetic field, such as a magnetic field of a data bit stored on the data discs. In some embodiments, the side biasing magnets or side shields 322 are formed of soft magnetic material (e.g., material that can be easily magnetized and demagnetized at relatively low magnetic fields). The soft magnetic material may be an alloy comprising Ni and Fe. The magnetoresistive sensor 302 is separated and electrically isolated from the side biasing magnets 322 by an isolation layer 324 including, for example, insulating materials. Isolation layer 324 may also be present in other regions of head 300 as shown in FIG. 3.

In the embodiment shown in FIG. 3, optional SAF shielding structure 314 includes a SAF shield reference layer 326, a thin SAF shield separation layer 328, which may comprise a metal such as Ru in some embodiments, a SAF shield pinned layer 330 and a SAF shield AFM layer 332. Because, in some embodiments, sensor 302 utilizes soft side shields 322, SAF shield reference layer 326 has a relatively fixed magnetization to assist in stabilizing the magnetizations of side shields 322. Thus, AFM layer 332 pins the magnetization of layer SAF shield pinned layer 330 substantially parallel to the bearing surface, which results in the relatively fixed magnetization of SAF shield reference layer 326 due to antiferromagnetic coupling across SAF shield separation layer 328 and thus in stabilizing the magnetizations of the side shields 322 substantially parallel to the bearing surface as well. SAF shield reference layer 326 and SAF shield pinned layer 330 may be formed of a soft magnetic material (for example, an alloy comprising Ni and Fe). It should be noted that, instead of employing SAF shielding structure 314, side shields 322 may be stabilized by shape anisotropy, by employing hard magnetic layers adjacent to the soft magnetic layers within side shield 322, or by any other suitable technique.

As indicated above, sensor 302 utilizes TMR effects. Further, as indicated above, sensor 302 employs multi-layered element 308, which serves as a tunneling barrier layer that separates the SAF structure 306 from the free layer 310. The tunneling barrier layer 308 is sufficiently thin that quantum mechanical electron tunneling occurs between a reference layer 320 in the SAF structure 306 and the free layer 310. The electron tunneling is electron-spin dependent, making the magnetic response of the magnetoresistive sensor 302 a function of the relative orientations and spin polarizations of the SAF structure 306 and the free layer 310. The highest probability of electron tunneling occurs when the magnetic moments of the SAF structure 306 and the free layer 310 are parallel, and the lowest probability of electron tunneling occurs when the magnetic moments of the SAF structure 306 and the free layer 310 are antiparallel. Accordingly, the electrical resistance of the magnetoresistive sensor 302 changes in response to an applied magnetic field. The data bits on the data discs in the disc drive may be magnetized in a direction normal to the plane of FIG. 3, either into the plane of the figure, or out of the plane of the figure. Thus, when the magnetoresistive sensor 302 passes over a data bit, the magnetic moment of the free layer 310 is rotated either into the plane of FIG. 3 or out of the plane of FIG. 3, changing the electrical resistance of the magnetoresistive sensor 302. The value of the bit being sensed by the magnetoresistive sensor 302 (for example, either 1 or 0) may therefore be determined based on the current flowing from a first electrode (not shown) to a second electrode (not shown) connected to the magnetoresistive sensor 302.

As indicated above, embodiments of the disclosure provide a tunnel barrier layer formation technique that helps reduce RA without reducing TMR. In embodiments of the disclosure, formation a magnesium oxide (MgO) tunnel barrier layer is provided. However, other suitable metal oxide layers may be employed as the barrier layer.

One traditional technique of depositing an MgO barrier material in a reader stack uses a radio frequency (RF) deposition process, which has a disadvantage of plasma damage from using oxygen ions. In addition, the ion bombardment to a module shield may cause contamination of the barrier layer. This damage could be more pronounced in a low RA region. Another technique for preparation of the MgO barrier uses natural oxidation, which does not have the issue of plasma damage, and therefore it could enable formation of a low RA reader with a high signal to noise ratio. However, one challenge of the natural oxidation MgO barrier process is to ensure the right stoichiometry of the MgO.

In order to address the above-noted challenges, in embodiments of the disclosure, a barrier structure is formed by employing multiple Mg layers and oxidizing those layers. The oxidation process is carefully tailored to allow oxidation of the Mg, layer by layer, using the right dose of oxygen.

In one embodiment, a method includes applying oxidation to a top of a reference layer. The method also includes depositing a plurality of different magnesium layers over the reference layer, and providing different oxidation doses at different temperatures to different layers of the plurality of magnesium layers. The method further includes performing an annealing operation after depositing at least two of the plurality of different magnesium layers. A more detailed method embodiment is described further below in connection with FIG. 5 after a brief description of the kinetics of an Mg oxidation process provided below in connection with FIGS. 4A, 4B and 4C.

Figure 4A:
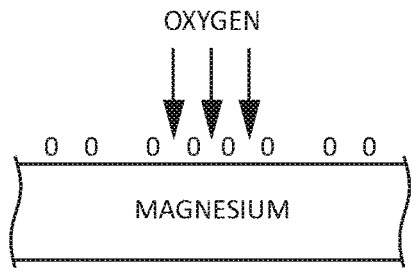
FIGS. 4A 4B and 4C are diagrammatic illustrations showing kinetics of a magnesium (Mg) oxidation process.
Figure 4B:
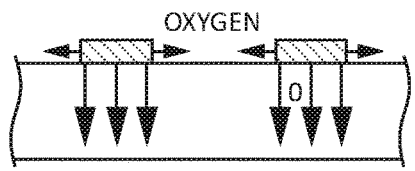
Figure 4C:
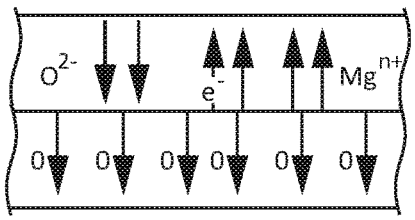

FIGS. 4A 4B and 4C are diagrammatic illustrations showing the kinetics of an Mg oxidation process. A mechanism of natural oxidation for MgO shown in FIGS. 4A, 4B and 4C first involves formation of a chemisorped monolayer of oxygen molecules ($O_2$) on a surface of Mg. The adsorbed $O_2$ captures electrons from the Mg surface and creates O-anions. From one side, electrons from the Mg deep space charge continue to defuse up from the metal to the surface and ionize the oxygen molecules. From the other side, the electric field from the space charge increases the migration of the oxygen anions down and the electrons up through the oxide. As the film thickens, the electric field from the space charge reduces and the reaction rate falls. Therefore, the thinner the Mg layer is, the better.

Embodiments of the disclosure provide a technique for oxidizing Mg layers, which may be deposited using a direct current (DC) sputtering method. In embodiments of the disclosure, ultrathin layers of Mg are deposited at different temperatures and oxidized at different points of the process in order to ensure that a stoichiometric MgO barrier is produced and that high TMR at low RA is achieved.

Figure 5:
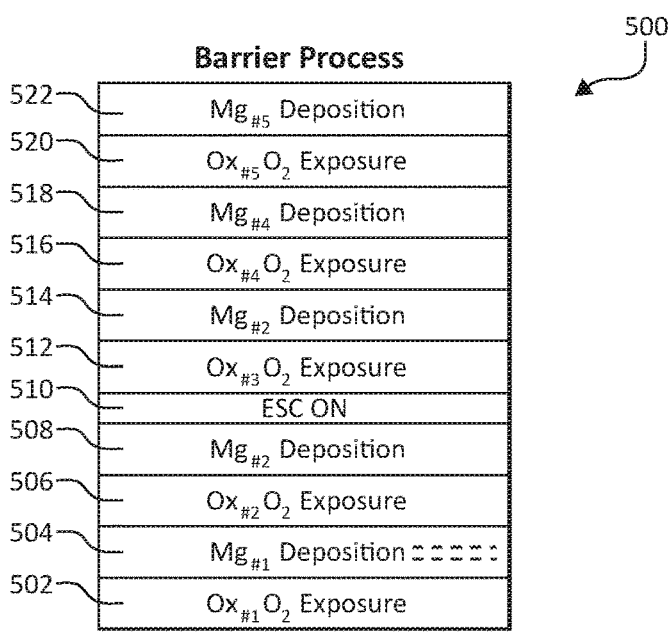
FIG. 5 is a flow diagram of a method embodiment.

FIG. 5 is a flow diagram of a method 500 in accordance with one embodiment. At 502, light oxidation is applied to a top of a reference layer such as 320 (of FIG. 3). The light oxidation is carried out at room temperature (e.g., between about 15 degrees Celsius (° C.) and about 25° C.) and with a very low $O_2$ dose ranging between about 1 SCCM (where SCCM stands for Standard Cubic Centimeters per minute) and about 2 SCCM. This provides an oxygen-terminated surface of the reference layer from which oxygen will diffuse to help fully oxidize a bottom of a first Mg layer, which is deposited on the reference layer. At 504, the first Mg layer is deposited on the reference layer at room temperature with a thickness ranging between about 2.5 angstroms (Å) and about 5 Å. This helps reduce a probability of interface intermixing between the reference layer and the barrier layer. Dashed lines are included within the first Mg layer in FIG. 5 to indicate that, in some embodiments, instead of depositing a single Mg layer at room temperature, multiple Mg layers may be deposited at room temperature. It should be noted that, in such embodiments, deposition of each of the multiple Mg layers (other than the top most Mg layer) is followed by oxidation of the respective Mg layer at room temperature.

At 506, the first Mg layer (or the room temperature deposed multi-layer that constitutes the first Mg layer) is oxidized at a high temperature ranging between about 200° C. and about 275° C. and with an oxidation doze ranging between about 4 SCCM and about 10 SCCM. It should be noted that oxidation 506 is carried out when a wafer including any underlayers, the reference layer and the first Mg layer is on a heated wafer support with the wafer not clamped (e.g., not chucked) to the wafer support. Oxidation 506 is followed by the deposition 508 of an ultrathin second layer of Mg at the same temperature ranging between about 200° C. and about 275° C. (e.g., when the wafer is on the heated wafer support but not clamped to the heated wafer support). At 510, the wafer is electrostatically chucked on the heated wafer support to increase the wafer temperature by, for example, about 75° C. and to allow the crystallization of a stoichiometric MgO to be achieved. This in-situ anneal time is for a time period between about 100 and about 600 seconds. This is then followed by 512 at which the third oxidation process take place at a high wafer temperature by keeping the wafer chucked on to the heated wafer support and exposing it to an oxidation dose ranging between about 4 SCCM and about 10 SCCM. At 514 and 518, respectively, two additional depositions (of third and fourth Mg layers) and, at 516 and 520, oxidations of the respective third and fourth Mg layers are carried out, keeping the wafer chucked to the heated wafer support. By the above process, a better stoichiometric and crystallized MgO for the higher RA targeting is produced. More repeats of Mg deposition and oxidation may be used to target even higher RA. At 522, a fifth Mg layer is deposited. This Mg layer is at an interface of a top of the barrier (e.g., 308 of FIG. 3) and the bottom of the free layer (e.g., 310 of FIG. 3). The fifth Mg layer helps reduce intermixing of the barrier layer material with the free layer material. It should be noted that the Mg layers other than the first Mg layer may be about 1 Å in thickness.

In the above described process of FIG. 5, a number of multilayers of Mg may be determined based on a target RA of the magnetic tunneling junction. For example, to increase RA, one or more additional Mg layer depositions and oxidations may be performed between 520 and 522. Any such additional Mg layer depositions followed by oxidations of the respective Mg layer(s) may be carried out at the high temperature when the wafer is electrostatically chucked to the wafer support. If a lower RA is desired, fewer Mg layers may be employed. For example, in one embodiment, the fourth Mg layer may be eliminated. In such an embodiment, 518 and 520 are not performed. In another embodiment, to further decrease RA, the third and fourth Mg layers may be eliminated. In this case, 514-520 are not performed. It should be noted that each individual stage of the process of FIG. 5 serves a different job.

Figure 6:
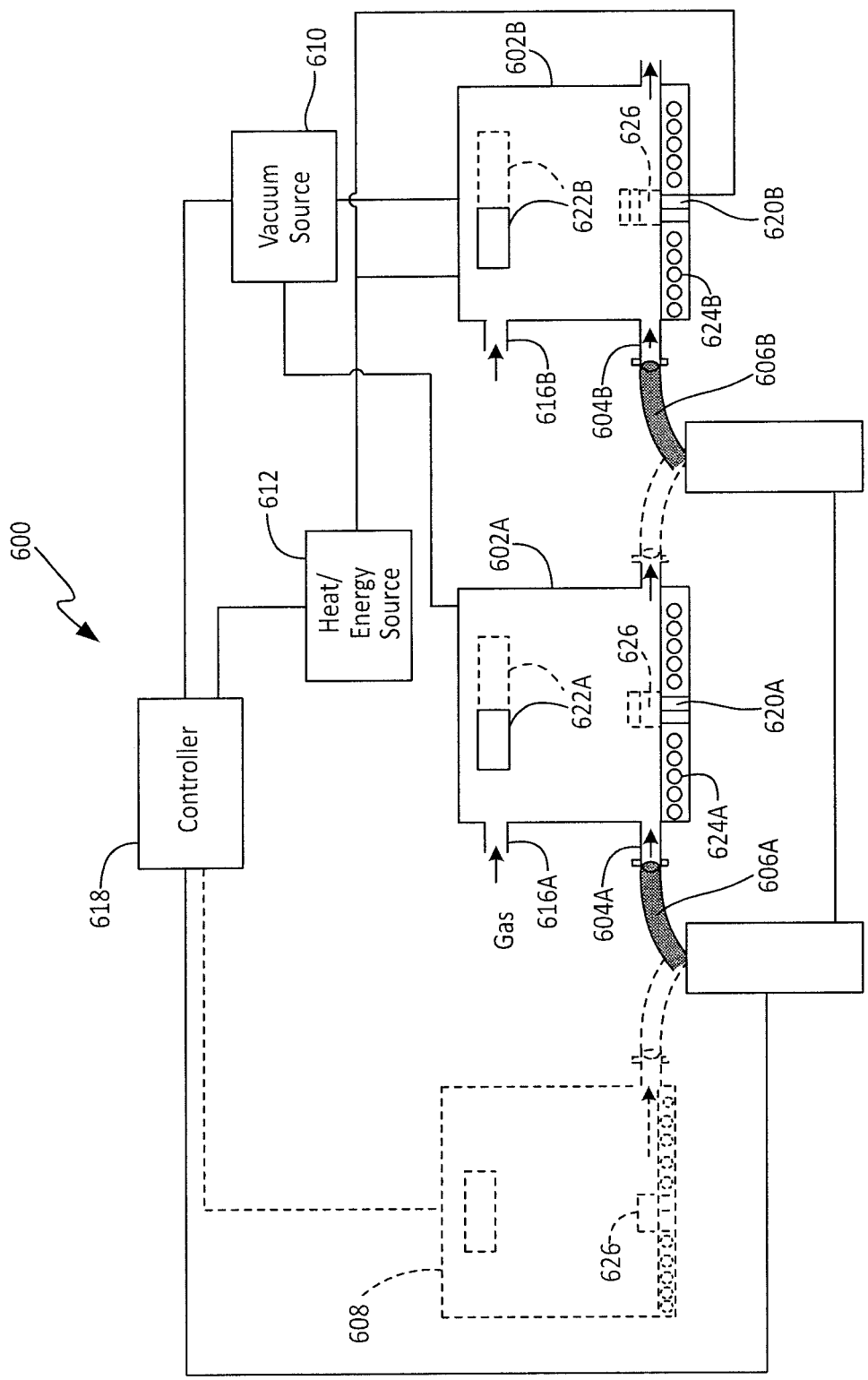
FIG. 6 is a diagrammatic illustration of an example apparatus that may be utilized to carry out deposition of a multi-layer barrier over a wafer having a reference layer as its top-most layer in accordance with one embodiment.

FIG. 6 is a diagrammatic illustration of an example apparatus 600 that may be utilized to carry out deposition of a multi-layer barrier over a wafer having a reference layer as its top-most layer in accordance with one embodiment. In the embodiment of FIG. 6, room temperature operations such as the oxidation of the reference layer (e.g., 502 of FIG. 5) and the deposition of the of the first Mg layer (e.g., 504 of FIG. 5) are carried out in one chamber (denoted by 602A in FIG. 6) and high temperature operations (506-522 of FIG. 5) are carried out in another chamber (denoted by 602B in FIG. 6). Each of chambers 602A and 602B may be evacuated by one or more vacuum sources 610 connected to controller 618. Chamber 602A includes a wafer support 620A and a transport element 624A. In chamber 602B, those elements are denoted by 620B and 624B, respectively. Chamber 602A includes a gas inlet 616A through which $O_2$ may be introduced and chamber 602B may include a similar gas inlet 616B.

Under layers (e.g., 222, 304, 316 and 318 of FIG. 3) and reference layer (320 of FIG. 3) may be deposited over a substrate by previous processing stage elements 608. The resulting multi-layered structure 626 is introduced into chamber 602A for further processing. The transfer of the multi-layered structure 626 from element 608 to chamber 602A may be carried out with the help of robot arm 606A, which transports that the multi-layered structure 626 from element 608 to loading/input element 604A that introduces structure 626 into chamber 602A. Once the multi-layered structure 626 is within the chamber 602A, the reference layer, which is the uppermost layer of structure 626, is oxidized at room temperature in a manner described above in connection with FIG. 5 by introducing $O_2$ through inlet 616A. Thereafter, the first Mg layer is deposited at room temperature with chamber 602A by, for example, DC sputtering using barrier material target 622A in accordance with 504 (of FIG. 5).

In the embodiment of FIG. 6, upon completion of the deposition of the first Mg layer, the multi-layered structure 626 with the first Mg layer is transferred from chamber 602A to chamber 602B. The transfer is carried out by robot arm 606B, which transports the multi-layered structure 626 with the first Mg layer from chamber 602A to loading/input element 604B that introduces the structure into chamber 602B. Once the multi-layered structure 626 is within the chamber 602B, it is heated within chamber 602B by wafer support 620B whose temperature is elevated by heat/energy source 614 connected to controller 618. It should be noted that, at this stage, the wafer is not clamped (e.g., not chucked to the wafer support 620B). In the unclamped state, the heated wafer with the uppermost first Mg layer is oxidized in a manner described above in connection with FIG. 5 by introducing $O_2$ through inlet 616B. Oxidation of the first Mg layer is followed by the deposition of an ultrathin second layer of Mg on the unclamped wafer in a manner described above in connection with FIG. 5 by, for example, DC sputtering using barrier material target 622B. The wafer is then electrostatically chucked to wafer support 820B and annealing and other operations are carried out in a manner described above in connection with FIG. 5.

Figure 7:
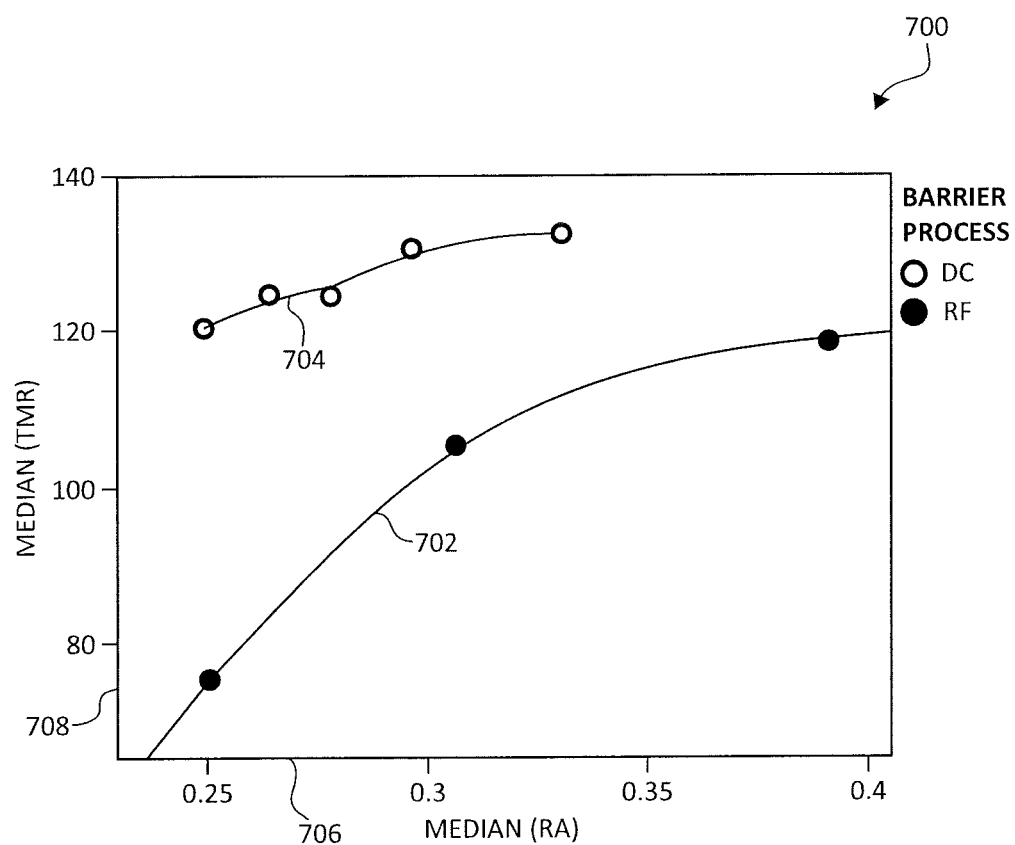
FIG. 7 is a graph of experimental results.

FIG. 7 is a graph 700 showing TMR versus RA of a RF barrier process (plot 702) in comparison with the DC barrier process (plot 704) described above in connection with FIG. 5. In FIG. 7, a horizontal axis 706 denotes median RA and a vertical axis 708 denotes median TMR. From FIG. 7, it is seen that the DC barrier process provides a significantly higher TMR, especially at lower RA. This may be explained by possible high damage the RF process causes to the interface, which becomes more evident at lower RA.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method of forming a metal oxide barrier layer, the method comprising:

oxidizing a magnetic reference layer to provide an oxygen-terminated magnetic reference layer surface;
depositing a plurality of different metal layers over the oxygen-terminated magnetic reference layer surface;
providing different oxidation doses at different temperatures to different layers of the plurality of metal layers; and
performing an annealing operation after depositing at least two of the plurality of different metal layers.

2. The method of claim 1 and wherein each of the plurality of different metal layers comprises magnesium.

3. A method comprising:
oxidizing a magnetic reference layer to provide an oxygen-terminated magnetic reference layer surface;
depositing a plurality of different magnesium layers over the oxygen-terminated magnetic reference layer surface; and
providing oxidation doses at different temperatures to different layers of the plurality of magnesium layers.

4. The method of claim 3 and further comprising performing an annealing operation after depositing at least two of the plurality of different magnesium layers.

5. The method of claim 4 and wherein the oxidizing the magnetic reference layer is carried out at room temperature, and wherein the oxidizing the magnetic reference layer is carried out using a dose of oxygen between about 1 Standard Cubic Centimeters per minute (SCCM) and about 2 SCCM.

6. The method of claim 4 and further comprising, prior to the annealing operation, increasing a temperature of a wafer comprising the magnetic reference layer and the at least two of the plurality of different magnesium layers from a first temperature level that is above room temperature, attained when the wafer is on a heated wafer support, to a second temperature level that is higher than the first temperature level.

7. The method of claim 6 and wherein the wafer is electrostatically chucked to a wafer support to increase the temperature of the wafer from the first temperature level to the second temperature level.

8. A method comprising:
oxidizing a magnetic reference layer to provide an oxygen-terminated magnetic reference layer surface;
depositing a plurality of different magnesium layers over the oxygen-terminated magnetic reference layer surface;
providing different oxidation doses at different temperatures to different layers of the plurality of magnesium layers; and
performing an annealing operation after depositing at least two of the plurality of different magnesium layers, the annealing operation being an intermediate process carried out before providing any oxidation dose to at least one of the plurality of magnesium layers.

9. The method of claim 8 and wherein the oxidizing the magnetic reference layer is carried out at room temperature.

10. The method of claim 9 and wherein the depositing the plurality of different magnesium layers over the oxygen-terminated magnetic reference layer surface comprises depositing a first magnesium layer of the plurality of magnesium layers at room temperature.

11. The method of claim 10 and wherein the providing the different oxidation doses at different temperatures to different layers of the plurality of magnesium layers comprises oxidizing the first magnesium layer at a high temperature ranging between about 200 degrees Celsius (° C.) and about 275° C. and with an oxidation doze ranging between about 4 Standard Cubic Centimeters per minute (SCCM) and about 10 SCCM.

12. The method of claim 11 and wherein the depositing the plurality of different magnesium layers over the oxygen-terminated magnetic reference layer surface further comprises depositing, over the oxidized first magnesium layer, a second magnesium layer of the plurality of magnesium layers, the second magnesium layer being thinner than the first magnesium layer.

13. The method of claim 12 and further comprising performing the annealing operation after the depositing the second magnesium layer over the oxidized first magnesium layer, the annealing operation being carried out for a time period between about 100 seconds and about 200 seconds.

14. The method of claim 13 and further comprising, prior to the annealing operation, increasing a temperature of a wafer comprising the magnetic reference layer, the oxidized first magnesium layer and the second magnesium layer from a first temperature level that is above room temperature, attained when the wafer is on a heated wafer support, to a second temperature level that is higher than the first temperature level.

15. The method of claim 14 and wherein the wafer is electrostatically chucked to the wafer support to increase the temperature of the wafer from the first temperature level to the second temperature level.

16. The method of claim 15, and wherein the providing the different oxidation doses at different temperatures to different layers of the plurality of magnesium layers further comprises, while the wafer is electrostatically chucked to the wafer support, oxidizing the second magnesium layer with an oxidation doze ranging between about 4 SCCM and about 10 SCCM.

17. The method of claim 16 and wherein the depositing the plurality of different magnesium layers over the oxygen-terminated magnetic reference layer surface further comprises depositing, while the wafer is electrostatically chucked to the wafer support, third and fourth magnesium layers.

18. The method of claim 17 and wherein the providing the different oxidation doses at different temperatures to different layers of the plurality of magnesium layers further comprises, while the wafer is electrostatically chucked to the wafer support, oxidizing the third magnesium layer and oxidizing the fourth magnesium layer after the fourth magnesium layer is deposited on the oxidized third magnesium layer.

19. The method of claim 17 and further comprising depositing a fifth magnesium layer over the oxidized fourth magnesium layer, the fifth magnesium layer serving a magnesium substrate layer on which a free layer is deposited, the deposited free layer being in direct contact with the magnesium substrate layer.

20. A read sensor formed by the method of claim 8.

* * * * *